US012641735B2

(12) United States Patent (10) Patent No.: US 12,641,735 B2

Katayama (45) Date of Patent: May 26, 2026

(54) ELECTRONIC COMPONENT UNIT AND WIRE HARNESS

(71) Applicant: YAZAKI CORPORATION, Tokyo (JP)

(72) Inventor: Kazutaka Katayama, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 98 days.

(21) Appl. No.: 18/946,897

(22) Filed: Nov. 13, 2024

(65) Prior Publication Data

US 2025/0071913 A1 Feb. 27, 2025

Related U.S. Application Data

(63) Continuation of application No. PCT/JP2023/036838, filed on Oct. 11, 2023.

(30) Foreign Application Priority Data

Nov. 16, 2022 (JP) ................................. 2022-183342

(51) Int. Cl.
*H05K 5/00* (2006.01)
*H01R 13/621* (2006.01)
*H02G 3/16* (2006.01)

(52) U.S. Cl.
CPC ....... *H05K 5/0026* (2013.01); *H01R 13/6215* (2013.01); *H02G 3/16* (2013.01)

(58) Field of Classification Search
CPC .................................................. H05K 5/0026
USPC .................................................... 361/679.01
See application file for complete search history.

(56) References Cited

U.S. PATENT DOCUMENTS

| | | | | |
|---|---|---|---|---|
| 2017/0311460 A1* | 10/2017 | Ozaki | ..................... | H02G 3/086 |
| 2018/0175549 A1 | 6/2018 | Nishio et al. | | |
| 2021/0052222 A1* | 2/2021 | Chahine | .............. | A61B 5/6804 |
| 2021/0144867 A1* | 5/2021 | Wang | ................... | H05K 7/1405 |
| 2022/0039722 A1* | 2/2022 | Abercrombie, II | .... | A61B 5/257 |
| 2022/0209518 A1 | 6/2022 | Isaji et al. | | |

FOREIGN PATENT DOCUMENTS

| | | |
|---|---|---|
| EP | 0793304 A2 | 9/1997 |
| JP | S53-112437 U | 9/1978 |
| JP | H10-21992 A | 1/1998 |
| JP | 2006-92776 A | 4/2006 |

(Continued)

OTHER PUBLICATIONS

Japanese Office Action for the related Japanese Patent Application No. 2022-183342 dated Aug. 28, 2024.

*Primary Examiner* — Stanley Tso

(74) *Attorney, Agent, or Firm* — KENEALY VAIDYA LLP

(57) ABSTRACT

An electronic component unit includes: a connection unit including a connector; an electrical connection box including a mating connector connected to the connector; and a first positioning portion including a protrusion provided on the electrical connection box and having a first through hole fastened with a bolt, and a pocket portion provided in the connection unit and having an insertion space portion into which the protrusion is inserted and a second through hole which is aligned with the first through hole in a fastening direction and into which the bolt is inserted.

8 Claims, 5 Drawing Sheets

(56)     References Cited

FOREIGN PATENT DOCUMENTS

| JP | 2016-219237 A | 12/2016 |
|----|---------------|---------|
| JP | 2017-130258 A | 7/2017 |
| JP | 2020-188525 A | 11/2020 |

* cited by examiner

ELECTRONIC COMPONENT UNIT AND WIRE HARNESS

CROSS-REFERENCE TO RELATED APPLICATION(S)

This application is a continuation application of International Application PCT/JP2023/036838, filed on Oct. 11, 2023 which claims the benefit of priority from Japanese Patent Application No. 2022-183342 filed on Nov. 16, 2022 and designating the U.S., the entire contents of which are incorporated herein by reference.

BACKGROUND OF THE INVENTION

1. Field of the Invention

The present invention relates to an electronic component unit and a wire harness.

2. Description of the Related Art

As a technology related to an electronic component unit according to a related art, for example, Japanese Patent Application Laid-open No. 2020-188525 discloses an electronic component unit including a connection unit including a terminal provided at a terminal of a wiring member having conductivity, and an electrical connection box including a connection terminal electrically and mechanically connected to the terminal of the connection unit via a bolt.

By the way, in the electronic component unit described in Patent Literature 1 described above, for example, there is room for further improvement in terms of improving workability of connection work between the electrical connection box and the connection unit.

SUMMARY OF THE INVENTION

The present invention has been made in view of the above circumstances, and an object of the present invention is to provide an electronic component unit and a wire harness capable of further improving workability of connection work.

Solution to Problem

To achieve the above objection, an electronic component unit according to one aspect of the present invention includes a connection unit including a connector provided at a terminal of a wiring member having conductivity; an electrical connection box including a mating connector electrically and mechanically connected to the connector; a first positioning portion including a protrusion provided on one of the connection unit and the electrical connection box, protruding in an axial direction of the wiring member, and having a first through hole fastened with a bolt in a fastening direction intersecting the axial direction, and a pocket portion provided in the other of the connection unit and the electrical connection box, having one end in the axial direction opened, and having an insertion space portion into which the protrusion is inserted and a pair of second through holes which are provided in an upper wall on one side in the fastening direction in the insertion space portion and a lower wall of the other side in the fastening direction and aligned with the first through hole in the fastening direction and into which the bolt is inserted; and a second positioning portion including an annular protruding portion provided at one of a peripheral edge portion of the second through hole in an inner surface of the upper wall or the lower wall of the pocket portion and a peripheral edge portion of the first through hole in an upper surface of the protrusion that faces the upper wall or a lower surface of the protrusion that faces the lower wall and protruding in the fastening direction, and an annular recessed portion which are provided at the other of the peripheral edge portion of the first through hole and the peripheral edge portion of the second through hole and recessed in the fastening direction and into which the protruding portion is fitted.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Note that the present invention is not limited by the following embodiment. In addition, constituent elements in the following embodiment include those that can be easily replaced by those skilled in the art or those that are substantially the same. In the present specification, ordinal numbers are used only to distinguish components, members, parts, positions, directions, and the like, and do not indicate order or priority.

EMBODIMENT

Figure 1:
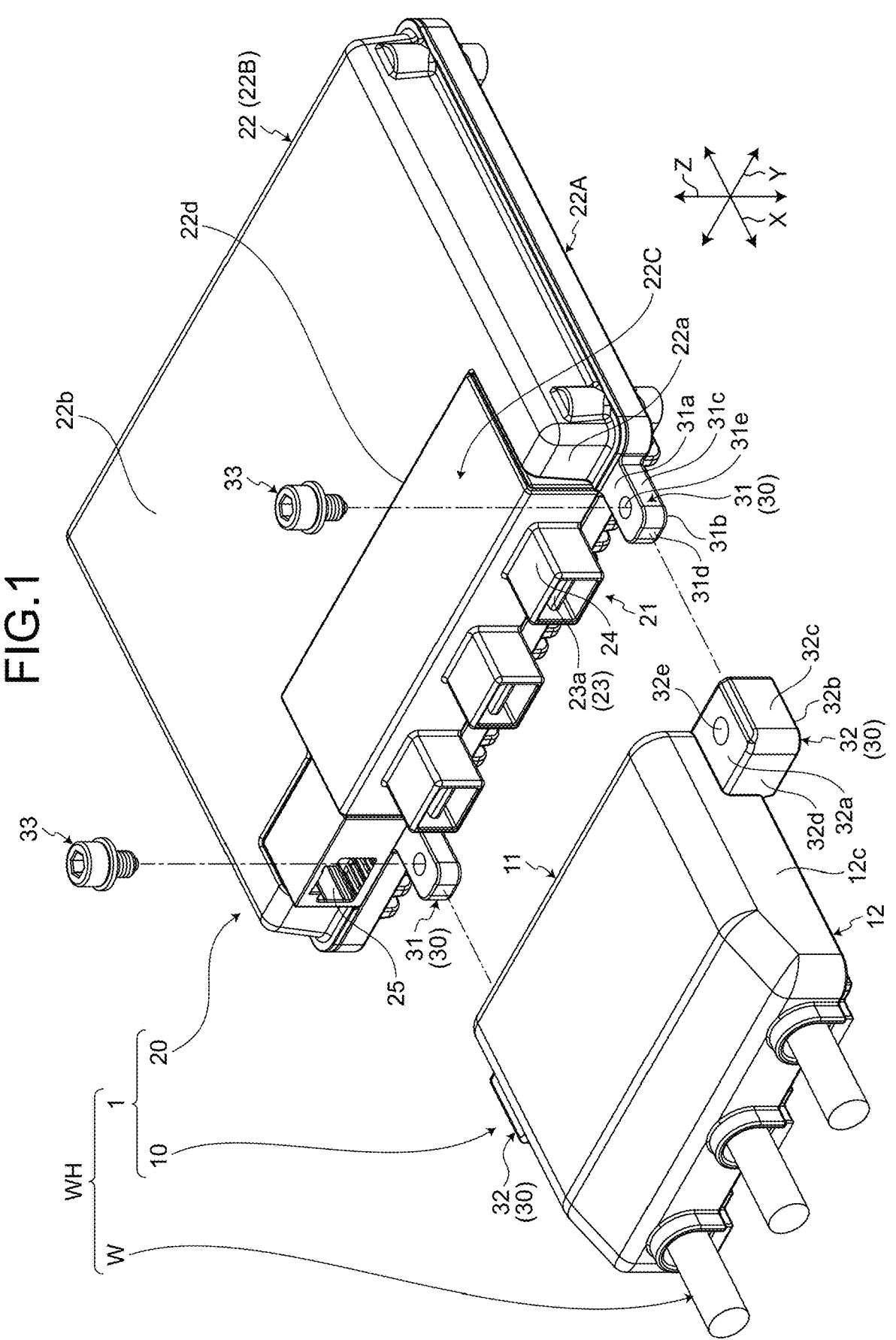
FIG. 1 is an exemplary perspective view of an electronic component unit applied to a wire harness according to an embodiment.

FIG. 1 is a perspective view of an electronic component unit 1 applied to a wire harness WH according to an embodiment. The electronic component unit 1 according to the present embodiment illustrated in FIG. 1 is incorporated in the wire harness WH routed in a vehicle such as an automobile. Here, for example, the wire harness WH is configured in such a way that a plurality of wiring members W used for power supply and signal communication are bundled to form an assembly component for connection between devices mounted on the vehicle, and the plurality of wiring members W are connected to the devices by a connector 11 or the like.

The wire harness WH includes the plurality of wiring members W having conductivity, and the electronic component unit 1 provided at terminals of the plurality of wiring members W. The wiring member W includes, for example, a conductor portion (core wire) obtained by twisting a plurality of linear metal strands, and an insulating covering portion covering an outer side of the conductor portion. The electronic component unit 1 includes, for example, a connection unit 10 through which the terminals of the wiring members W are inserted, an electrical connection box 20 connected to the connection unit 10, first and second positioning portions 30 and 40 described below, and the like. The wire harness WH may further include a protector, a grommet, a fixing tool, and the like.

In the following description, a first direction is referred to as an "axial direction X", a second direction is referred to as a "width direction Y", and a third direction is referred to as a "fastening direction Z", the first direction, the second direction, and the third direction intersecting one another. Here, the axial direction X, the width direction Y, and the fastening direction Z are substantially orthogonal to each other. The axial direction X typically corresponds to an extending direction of the wiring member W inserted into the connection unit 10, an insertion/removal direction of the connector 11 of the connection unit 10 and a mating connector 21 of the electrical connection box 20, and the like. The fastening direction Z typically corresponds to a height direction (thickness direction) of the connection unit 10 and the electrical connection box 20, and a fastening direction of a bolt 33 that fixes the connection unit 10 and the electrical connection box 20. The width direction Y corresponds to a direction intersecting the axial direction X and the fastening direction Z. In addition, each direction used in the following description will be described as a direction in a state where the wiring member W is assembled to the connection unit 10 unless otherwise specified.

The electrical connection box 20 includes, for example, the mating connector 21 and a housing 22 for collectively housing electrical components such as a DC/DC converter, a DC/AC inverter, a branch portion, and a control unit (not illustrated) therein. The electrical connection box 20 is connected between a power supply such as a battery and various electronic devices mounted in the vehicle via the wiring member W or the like, and can distribute power supplied from the power supply to various electronic devices in the vehicle. The electrical connection box 20 is also referred to as a power distribution box, a junction box, or the like.

The housing 22 includes, for example, a case 22A, a cover 22B, and a connector housing 22C. The case 22A is formed of, for example, a metal material or the like together with a protrusion 31 of the first positioning portion 30 described below, and the cover 22B and the connector housing 22C are formed of a resin material or the like. The cover 22B and the connector housing 22C are assembled to the case 22A in a state of being stacked in the fastening direction Z, and the connector housing 22C is assembled to the cover 22B in a state of being aligned in the axial direction X. With such a configuration, the housing 22 is formed in a hollow box shape as a whole by combining the case 22A, the cover 22B, and the connector housing 22C. In the housing 22, an internal space portion defined by the case 22A, the cover 22B, and the connector housing 22C functions as a housing space portion 27 (see FIG. 5).

Specifically, the case 22A is formed in a bottomed tubular shape (tray shape) in which one side in the fastening direction Z is opened, the cover 22B is formed in a bottomed tubular shape (tray shape) in which the other side in the fastening direction Z is opened, and a peripheral edge portion of the case 22A and a peripheral edge portion of the cover 22B are coupled by snap-fitting or the like. As illustrated in FIG. 1, the cover 22B has a cutout portion 22d across a front wall 22a and a top wall 22b on the other side (a connection unit 10 side) in the axial direction X, and the connector housing 22C is assembled so as to close the cutout portion 22d. The connector housing 22C has, for example, a substantially L-shaped cross section having a portion forming the front wall 22a and a portion forming the top wall 22b together with the cover 22B, and is opened on one side in the axial direction X and both sides in the width direction Y. With such a configuration, the housing space portion 27 surrounded by the case 22A, the cover 22B, and the connector housing 22C is formed inside the housing 22.

The mating connector 21 includes, for example, a connector terminal 23 and the connector housing 22C that houses the connector terminal 23. The connector terminal 23 is connected to a substrate 26 (see FIG. 5) housed in the housing space portion 27 described above. Here, the connector terminal 23 is configured as a male terminal fitting including a tab terminal portion 23a electrically connected to the connector 11 and a substrate connection portion (not illustrated) electrically connected to the substrate 26. The connector terminal 23 is entirely made of a conductive metal, and each part is integrally formed by press-molding one sheet metal punched into a shape corresponding to each part. In the present embodiment, the mating connector 21 includes a plurality of (here, three) connector terminals 23 arranged in the width direction Y.

The connector housing 22C holds the connector terminal 23 therein. The connector housing 22C includes a fitting portion 24 protruding from the portion forming the front wall 22a to the other side (the connection unit 10 side) in the axial direction X. The fitting portion 24 is formed in, for example, a rectangular tubular shape covering a periphery of the tab terminal portion 23a of the connector terminal 23, and is fitted into an opening portion 12a (see FIG. 2) of the connector 11. In the present embodiment, the mating connector 21 includes a plurality of (here, three) fitting portions 24 arranged in the width direction Y, corresponding to the connector terminals 23. The fitting portion 24 protects the tab terminal portion 23a of the connector terminal 23. The connector housing 22C includes a connection port 25 that is adjacent to the fitting portion 24 in the width direction Y and is connectable to a communication cable such as a LAN cable.

Figure 2:
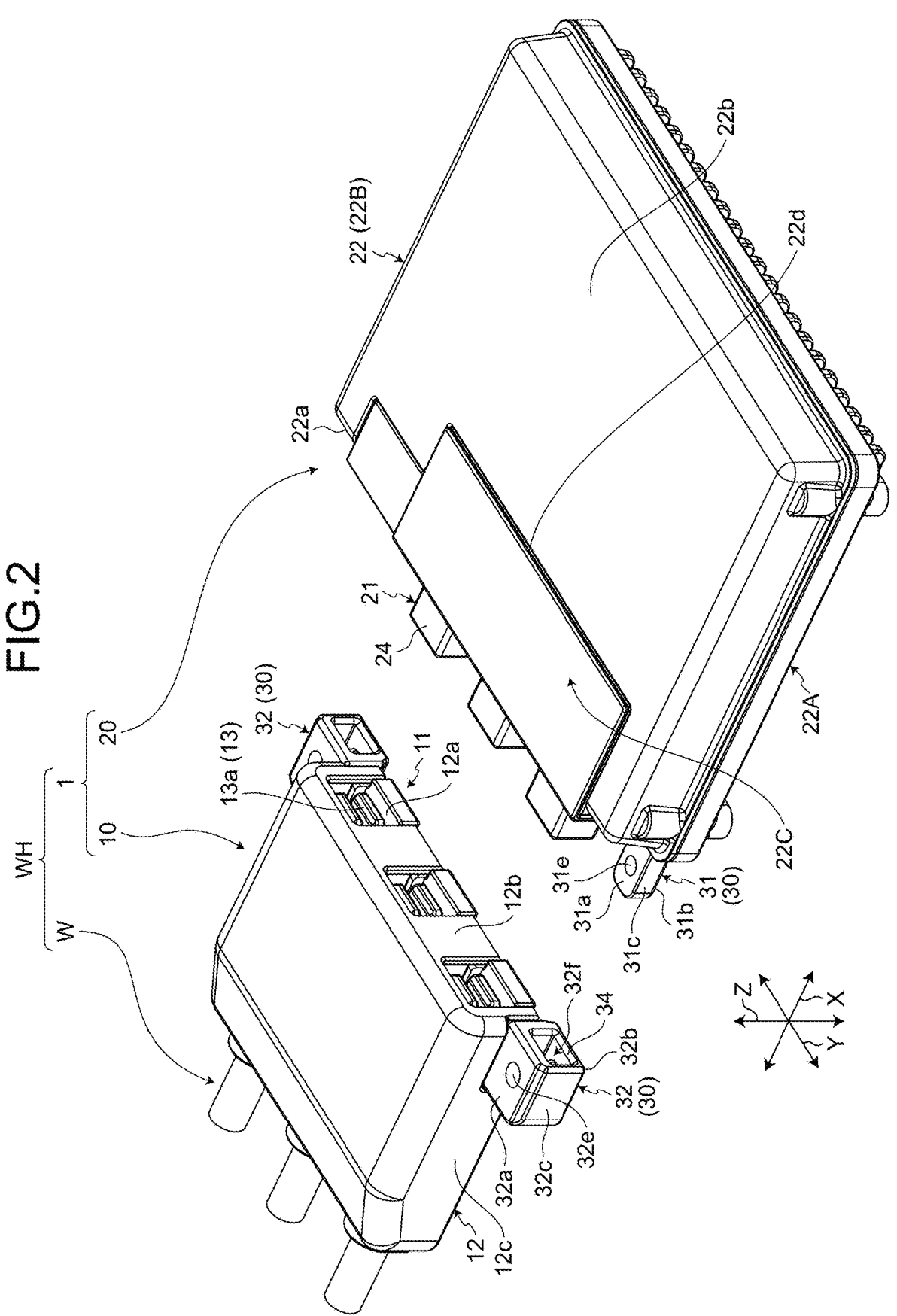
FIG. 2 is an exemplary perspective view of the electronic component unit applied to the wire harness according to the embodiment when viewed from an angle different from that in FIG. 1.

FIG. 2 is a perspective view of the electronic component unit 1 when viewed from an angle different from that in FIG. 1. As illustrated in FIG. 2, the connection unit 10 includes, for example, a housing 12 for collectively housing the connector 11, the terminals of the plurality of wiring members W, and the like therein. The housing 12 is formed of, for example, a resin material or the like together with a pocket portion 32 of the first positioning portion 30 described below. The housing 12 is formed in a hollow box shape as a whole, and an internal space portion defined by an outer wall of the housing 12 functions as a housing space portion. The connection unit 10 is also referred to as a connector unit or the like.

The connector 11 includes, for example, a connection terminal 13 and the housing 12 as a connector housing that houses the connection terminal 13. The connection terminal 13 is connected to the terminal of the wiring member W. Here, the connection terminal 13 is configured as a female terminal fitting including a fork terminal portion 13a electrically connected to the tab terminal portion 23a of the mating connector 21 described above and an electric wire connection portion (not illustrated) electrically connected to the conductor portion exposed to the terminal of the wiring member W. The connection terminal 13 is entirely made of a conductive metal, and each part is integrally formed by press-molding one sheet metal punched into a shape corresponding to each part. In the present embodiment, the connector 11 includes a plurality of (here, three) connection terminals 13 arranged in the width direction Y, corresponding to the connector terminals 23.

The housing 12 holds the connection terminal 13 and the terminal of the wiring member W therein. The opening portion 12a into which the fitting portion 24 described above is fitted is provided in a front wall 12b on one side (electrical connection box 20 side) of the housing 12 in the axial direction X. The opening portion 12a is formed as a space portion having a size and a shape to which the fitting portion 24 can be fitted according to an outer shape of the fitting portion 24, and here, a cross-sectional shape orthogonal to the axial direction X is a substantially rectangular shape. The opening portion 12a is provided in a state where the fork terminal portion 13a of the connection terminal 13 held by the housing 12 is exposed in the axial direction X. In the present embodiment, the connector 11 includes a plurality of (here, three) opening portions 12a arranged in the width direction Y, corresponding to the connection terminals 13. The fork terminal portion 13a of the connection terminal 13 is protected by a peripheral wall portion in the opening portion 12a.

The first positioning portion 30 includes, for example, the protrusion 31 and the pocket portion 32 into which the protrusion 31 is inserted. In the present embodiment, the protrusion 31 is provided on the front wall 22a of the housing 22 that is adjacent to the electrical connection box 20, and the pocket portion 32 is provided on a side wall 12c of the housing 12 that is adjacent to the connection unit 10. Here, a pair of first positioning portions 30 are provided on both sides in the width direction Y so as to sandwich the connector 11 and the mating connector 21. The first positioning portion 30 is not limited to this example, and for example, the protrusion 31 may be provided on the connection unit 10, and the pocket portion 32 may be provided in the electrical connection box 20.

Figure 3:
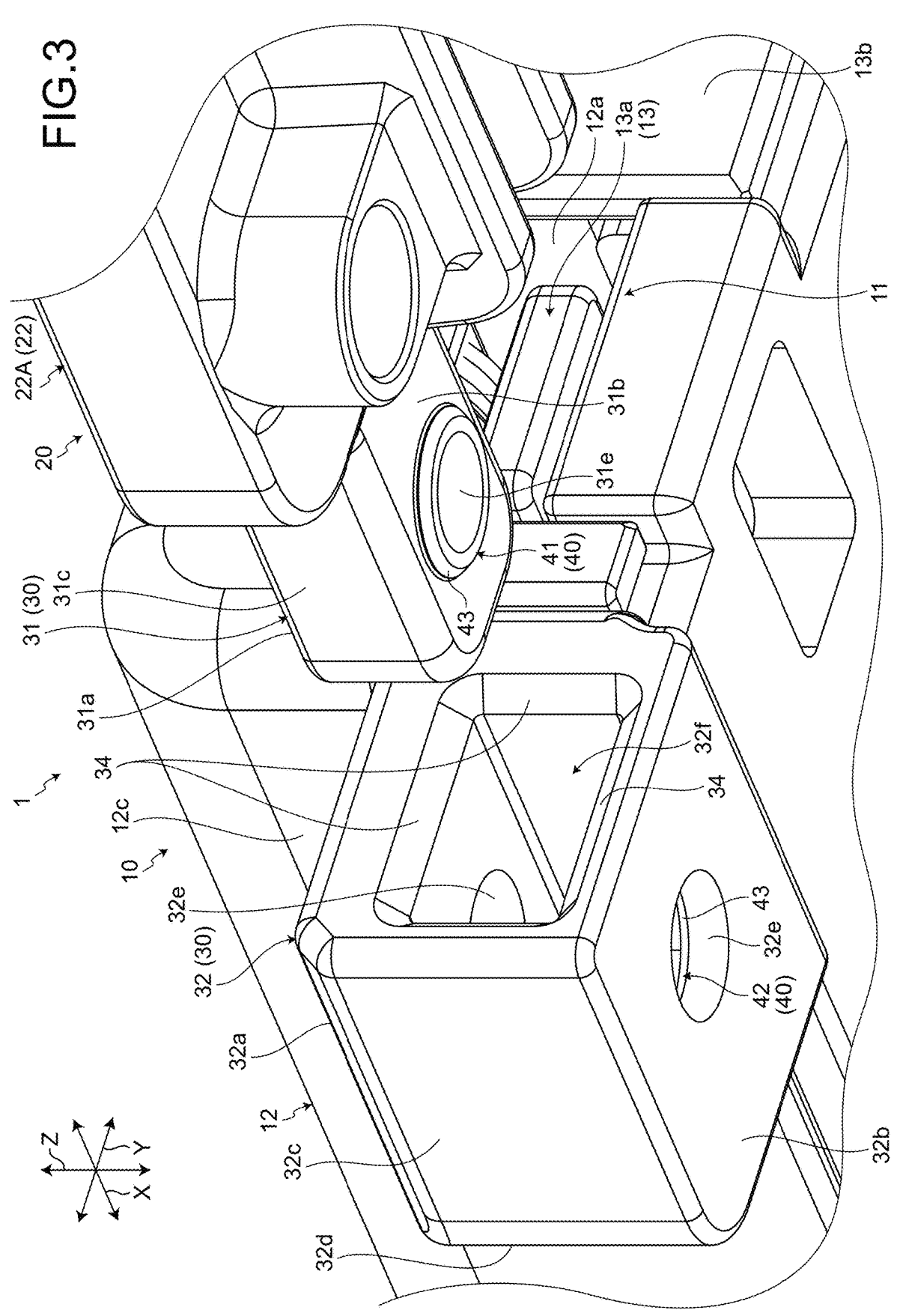
FIG. 3 is an exemplary perspective view of a first positioning portion and a second positioning portion of the electronic component unit applied to the wire harness according to the embodiment.

FIG. 3 is a perspective view of the first positioning portion 30 and the second positioning portion 40 of the electronic component unit 1. As illustrated in FIG. 3, the protrusion 31 is a portion which is formed integrally with the case 22A of the electrical connection box 20 so as to protrude in the axial direction X and is inserted into the pocket portion 32 of the connection unit 10. The protrusion 31 has, for example, an upper surface 31a on one side in the fastening direction Z, a lower surface 31b on the other side in the fastening direction Z, a pair of side surfaces 31c on both sides in the width direction Y, and a distal end surface 31d (see FIG. 4) on the other side (connection unit 10 side) in the axial direction X.

The protrusion 31 has a first through hole 31e penetrating in the fastening direction Z from the upper surface 31a to the lower surface 31b. The first through hole 31e is a through hole to which the bolt 33 (see FIG. 1) for coupling the protrusion 31 of the first positioning portion 30 and the pocket portion 32 is fastened. The first through hole 31e is formed in a round hole shape along a shaft portion of the bolt 33. In addition, a protruding portion 41 of the second positioning portion 40 described below is provided on a peripheral edge portion of the first through hole 31e on the lower surface 31b of the protrusion 31.

The pocket portion 32 is a portion which is formed integrally with the housing 12 of the connection unit 10 and into which the protrusion 31 of the electrical connection box 20 is inserted. The pocket portion 32 has, for example, an upper wall 32a on one side in the fastening direction Z, a lower wall 32b on the other side in the fastening direction Z, a pair of side walls 32c on both sides in the width direction Y, and a rear wall 32d on the other side in the axial direction X. The upper wall 32a faces the upper surface 31a of the protrusion 31, the lower wall 32b faces the lower surface 31b of the protrusion 31, the pair of side walls 32c face the pair of side surfaces 31c of the protrusion 31, and the rear wall 32d faces the distal end surface 31d of the protrusion 31. In the pocket portion 32, an insertion space portion 32f surrounded by the upper wall 32a, the lower wall 32b, the pair of side walls 32c, and the rear wall 32d and opened to one side (toward the protrusion 31) in the axial direction X is provided.

A second through hole 32e penetrating in the fastening direction Z is provided in each of the upper wall 32a and the lower wall 32b of the pocket portion 32. The second through hole 32e is a through hole into which the bolt 33 (see FIG. 1) for coupling the protrusion 31 and the pocket portion 32 is inserted in addition to the first through hole 31e described above. The second through hole 32e is formed in a round hole shape along the shaft portion of the bolt 33. A recessed portion 42 of the second positioning portion 40 described below is provided in a peripheral edge portion of the second through hole 32e in an inner surface of the lower wall 32b.

Figure 4:
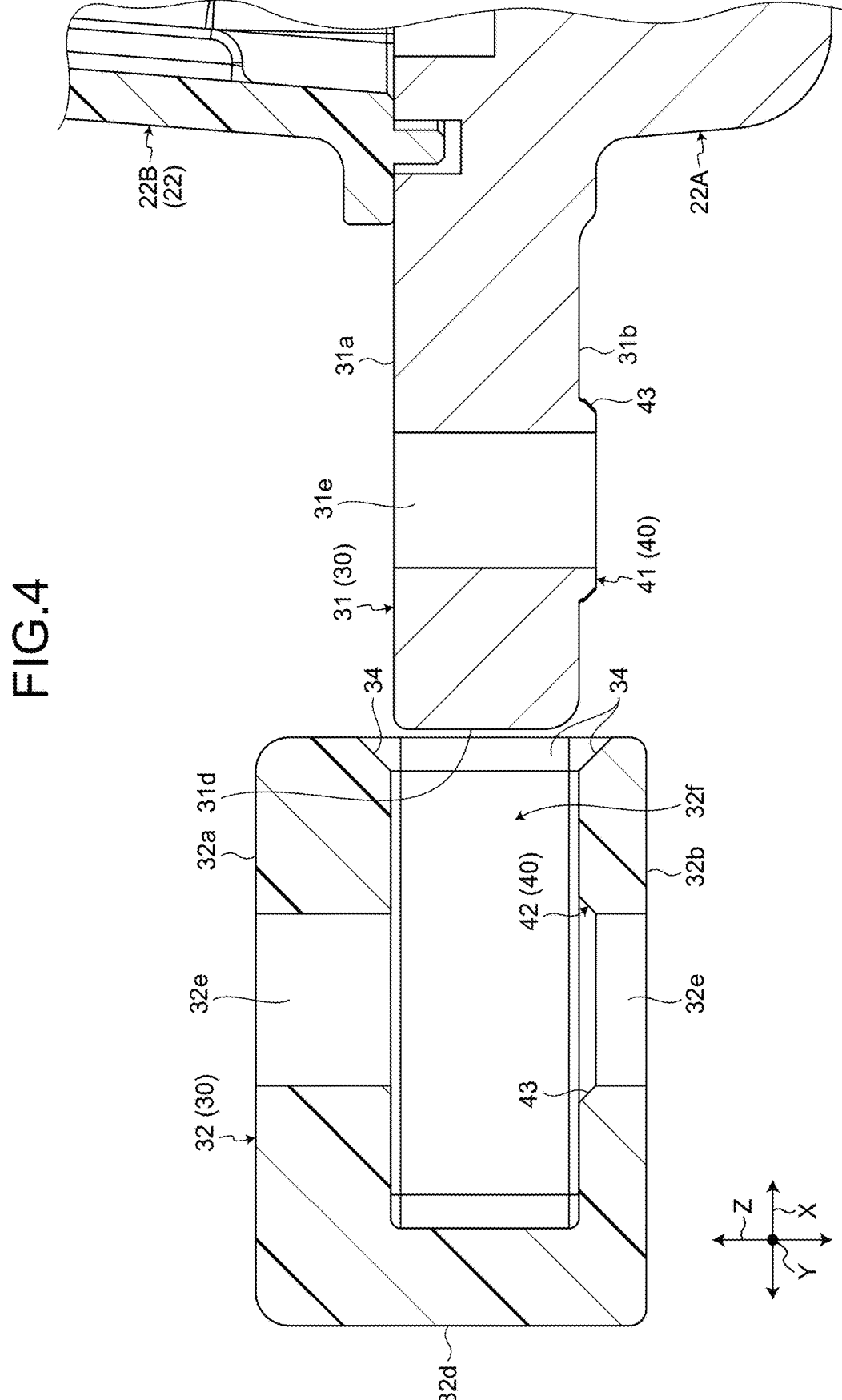
FIG. 4 is an exemplary cross-sectional view of the first positioning portion and the second positioning portion of the electronic component unit applied to the wire harness according to the embodiment in a state before press-fitting.

FIG. 4 is a cross-sectional view of the first positioning portion 30 and the second positioning portion 40 of the electronic component unit 1 in a state before press-fitting. As illustrated in FIG. 4, the second positioning portion 40 includes, for example, the protruding portion 41 and the recessed portion 42 to which the protruding portion 41 is fitted. In the present embodiment, the protruding portion 41 is provided on the lower surface 31b of the protrusion 31, and the recessed portion 42 is provided in the inner surface of the lower wall 32b of the pocket portion 32. The second positioning portion 40 is not limited to this example, and for example, the protruding portion 41 may be provided on the upper surface 31a of the protrusion 31, and the recessed portion 42 may be provided in the inner surface of the upper wall 32a of the pocket portion 32. Further, in the second positioning portion 40, for example, the protruding portion 41 may be provided on the upper wall 32a or the lower wall 32b of the pocket portion 32, and the recessed portion 42 may be provided in the upper surface 31a or the lower surface 31b of the protrusion 31.

The recessed portion 42 is formed in, for example, an annular shape along the peripheral edge portion of the second through hole 32e, and is recessed from the inner surface of the lower wall 32b of the pocket portion 32 toward the other side in the fastening direction Z. The recessed portion 42 is formed as a space portion having a size and a shape to which the protruding portion 41 can be fitted according to an outer shape of the protruding portion 41. A first tapered surface 43 is provided on an inner peripheral surface of the recessed portion 42. The first tapered surface 43 is formed in a tapered shape inclined inward in a radial direction of the second through hole 32e toward the other side in the fastening direction Z.

The protruding portion 41 is formed in, for example, an annular shape along the peripheral edge portion of the first through hole 31e, and protrudes from the lower surface 31b of the protrusion 31 toward the other side in the fastening direction Z. A first tapered surface 43 to be fitted to the first tapered surface 43 of the recessed portion 42 is provided on an outer peripheral surface of the protruding portion 41. Similarly to the first tapered surface 43 of the recessed portion 42, the first tapered surface 43 of the protruding portion 41 is formed in a tapered shape inclined inward in a radial direction of the first through hole 31e toward the other side in the fastening direction Z.

In the present embodiment, a thickness of the protrusion 31 in the fastening direction Z is set to be substantially the same as an opening width of the insertion space portion 32f in the pocket portion 32 in the fastening direction Z. A width (see FIG. 3) of the protrusion 31 in the width direction Y is set to be substantially the same as an opening width of the insertion space portion 32f in the pocket portion 32 in the width direction Y. Then, the protrusion 31 is attached to the insertion space portion 32f of the pocket portion 32 by press-fitting.

Figure 5:
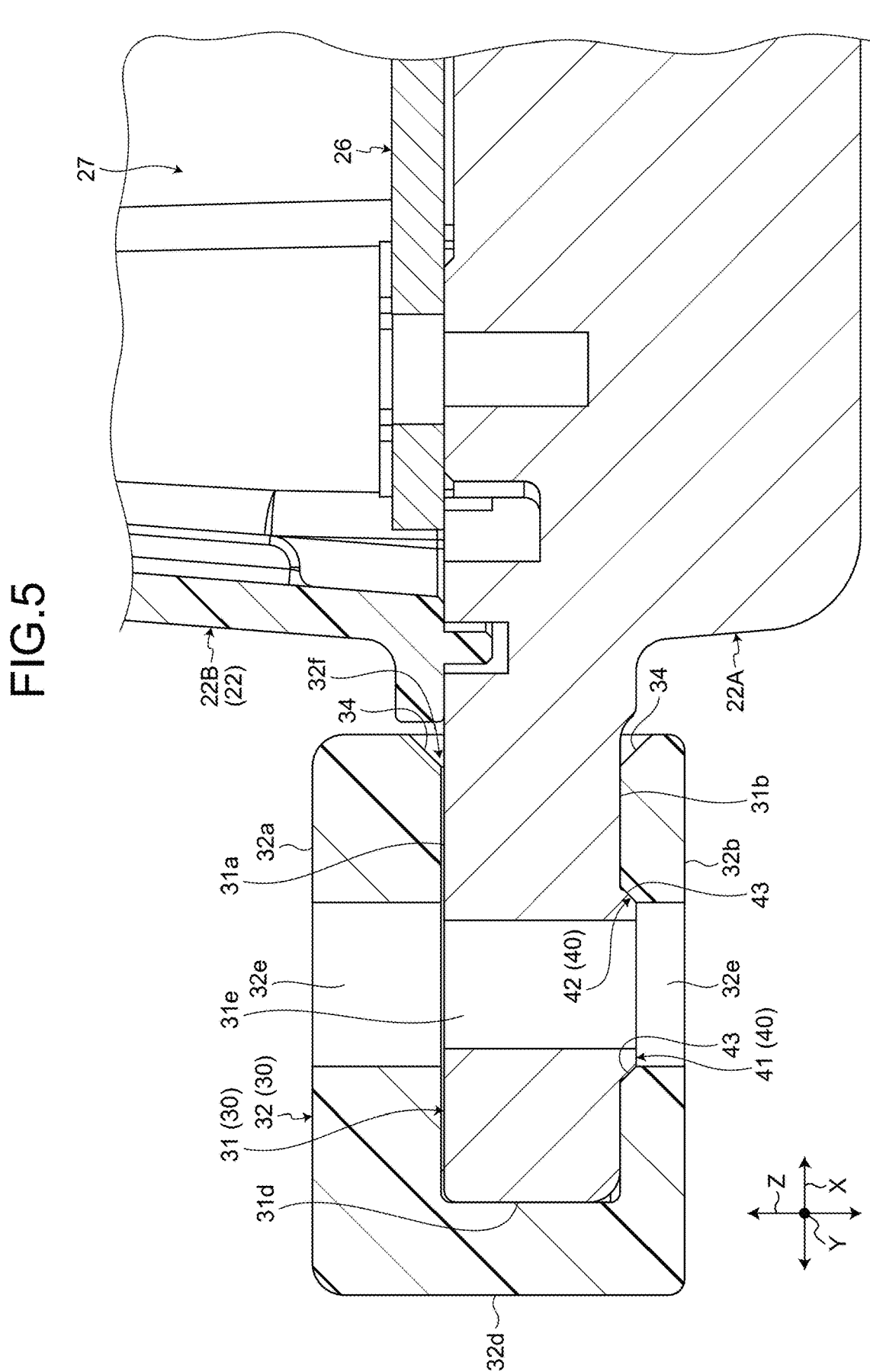
FIG. 5 is an exemplary cross-sectional view of the first positioning portion and the second positioning portion of the electronic component unit applied to the wire harness according to the embodiment in a state after press-fitting.

FIG. 5 is a cross-sectional view of the first positioning portion 30 and the second positioning portion 40 of the electronic component unit 1 in a state after press-fitting. As illustrated in FIG. 5, in the present embodiment, in a state where the protruding portion 41 and the recessed portion 42 of the second positioning portion 40 are fitted, the first through hole 31e of the protrusion 31 and the second through hole 32e of the pocket portion 32 are aligned in the fastening direction Z, and movement of the protrusion 31 in the axial direction X and the width direction Y with respect to the pocket portion 32 is restricted.

In the present embodiment, when the protrusion 31 is press-fitted into the insertion space portion 32f, that is, in a state between the state of FIG. 4 and the state of FIG. 5, the upper wall 32a and the lower wall 32b of the pocket portion 32 formed of a resin are elastically deformed in the fastening direction Z, so that the protruding portion 41 of the second positioning portion 40 can be relatively easily fitted into the recessed portion 42 without rattling. In addition, when the protruding portion 41 and the recessed portion 42 are fitted to each other, an operation of fitting the protruding portion 41 to the recessed portion 42 and an operation of releasing the fitting between the protruding portion 41 and the recessed portion 42 can be relatively easily performed by a guide function of the first tapered surface 43.

In the present embodiment, a second tapered surface 34 is provided at an open end portion of the insertion space portion 32f of the pocket portion 32. The second tapered surface 34 is inclined so as to spread to both sides in the fastening direction Z toward one side (an electrical connection box 20 side) in the axial direction X. The second tapered surface 34 (see FIG. 3) is inclined so as to spread to both sides in the width direction Y toward one side in the axial direction X. That is, the second tapered surface 34 is provided at an open end portion of each of the upper wall 32a, the lower wall 32b, and the pair of side walls 32c of the pocket portion 32. In the present embodiment, insertability of the protrusion 31 into the insertion space portion 32f is improved by a guide function of the second tapered surface 34.

As described above, the electronic component unit 1 and the wire harness WH according to the present embodiment include: the connection unit 10 including the connector 11 provided at the terminal of the wiring member W having conductivity; the electrical connection box 20 including the mating connector 21 electrically and mechanically connected to the connector 11; the first positioning portion 30 including the protrusion 31 provided on the electrical connection box 20, protruding in the axial direction X of the wiring member W, and having the first through hole 31e fastened with the bolt 33 in the fastening direction Z intersecting the axial direction X, and the pocket portion 32 provided in the connection unit 10, having one end in the axial direction X opened, and having the insertion space portion 32f into which the protrusion 31 is inserted and the pair of second through hole 32e which are provided in the upper wall 32a on one side in the fastening direction Z in the insertion space portion 32f and the lower wall 32b on the other side in the fastening direction Z and aligned with the first through hole 31e in the fastening direction Z and into which the bolt 33 is inserted; and the second positioning portion 40 including the annular recessed portion 42 provided at the peripheral edge portion of the second through hole 32e in the inner surface of the lower wall 32b of the pocket portion 32 and recessed in the fastening direction Z, and the annular protruding portion 41 provided at the peripheral edge portion of the first through hole 31e on the lower surface 31b facing the lower wall 32b of the protrusion 31, protruding in the fastening direction Z, and fitted into the recessed portion 42.

With such a configuration, the electronic component unit 1 and the wire harness WH can easily align the connector 11 of the connection unit 10 and the mating connector 21 of the electrical connection box 20 by inserting the protrusion 31 of the first positioning portion 30 into the insertion space portion 32f of the pocket portion 32 at the time of connection work between the electrical connection box 20 and the connection unit 10. In addition, at this time, by fitting the protruding portion 41 of the second positioning portion 40 to the recessed portion 42, it is possible to easily align the first through hole 31e of the protrusion 31 and the second through hole 32e of the pocket portion 32, and to temporarily fix the connection unit 10 to the electrical connection box 20. As a result, in the electronic component unit 1 and the wire harness WH, workability of the connection work between the electrical connection box 20 and the connection unit 10 can be further improved, and even in a case where the electrical connection box 20 and the connection unit 10 are mounted in a narrow portion of the vehicle, the connection work between the electrical connection box 20 and the connection unit 10 can be more easily performed.

In the electronic component unit 1 and the wire harness WH according to the present embodiment, the first positioning portion 30 and the second positioning portion 40 are provided as a pair on both sides in the width direction Y intersecting the axial direction X when viewed from the fastening direction Z so as to sandwich the connector 11 and the mating connector 21. With such a configuration, the electronic component unit 1 and the wire harness WH can suppress concentration of stress on a fitting part between the connector 11 and the mating connector 21 caused by, for example, twisting of the wiring member W at the time of the connection work between the electrical connection box 20 and the connection unit 10, and can disperse the stress to a fitting part between the protruding portion 41 and the recessed portion 42 of the second positioning portion 40 provided in each of the pair of first positioning portions 30. As a result, the electronic component unit 1 and the wire harness WH can further improve reliability of electrical connection between the connector 11 and the mating connector 21.

In the electronic component unit 1 and the wire harness WH according to the present embodiment, the first tapered surfaces 43 inclined inward in the radial direction of the first through hole 31*e* or the second through hole 32*e* toward the other side in the fastening direction Z are provided at the outer peripheral surface of the protruding portion 41 and the inner peripheral surface of the recessed portion 42, respectively. With such a configuration, in the electronic component unit 1 and the wire harness WH, insertability of the protruding portion 41 into the recessed portion 42 is improved by the guide function of the first tapered surface 43, and thus, the workability of the connection work between the electrical connection box 20 and the connection unit 10 can be further improved.

In the electronic component unit 1 and the wire harness WH according to the present embodiment, the upper wall 32*a* and the lower wall 32*b* of the pocket portion 32 are elastically deformable in the fastening direction z, and the protrusion 31 is attached to the insertion space portion 32*f* of the pocket portion 32 by press-fitting. With such a configuration, in the electronic component unit 1 and the wire harness WH, when the protrusion 31 is press-fitted into the insertion space portion 32*f*, the upper wall 32*a* and the lower wall 32*b* of the pocket portion 32 are elastically deformed in the fastening direction Z, so that the protruding portion 41 of the second positioning portion 40 can be fitted into the recessed portion 42 relatively easily without rattling.

In the electronic component unit 1 and the wire harness WH according to the present embodiment, the second tapered surface 34 inclined so as to spread to at least both sides in the fastening direction Z toward one side in the axial direction X is provided at the open end portion of the insertion space portion 32*f* of the pocket portion 32. With such a configuration, in the electronic component unit 1 and the wire harness WH, insertability of the protrusion 31 into the insertion space portion 32*f* of the pocket portion 32 is improved by the guide function of the second tapered surface 34, and thus, the workability of the connection work between the electrical connection box 20 and the connection unit 10 can be further improved.

Although the embodiment of the present invention has been exemplified above, the above embodiment is merely an example, and is not intended to limit the scope of the invention. The above-described embodiment can be implemented in various other forms, and various omissions, substitutions, combinations, and changes can be made without departing from the gist of the invention. In addition, specifications (structure, type, direction, form, size, length, width, thickness, height, number, arrangement, position, material, and the like) of each configuration, shape, and the like can be appropriately The electronic component unit and the wire harness according to the present embodiment can easily align the connector of the connection unit and the mating connector of the electrical connection box by inserting the protrusion of the first positioning portion into the insertion space portion of the pocket portion at the time of connection work between the electrical connection box and the connection unit. In addition, at this time, by fitting the protruding portion of the second positioning portion to the recessed portion, it is possible to easily align the first through hole of the protrusion and the second through hole of the pocket portion, and to temporarily fix the connection unit to the electrical connection box. As a result, the electronic component unit and the wire harness have an effect of further improving the workability of the connection work between the electrical connection box and the connection unit.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit comprising:
   a connection unit including a connector provided at a terminal of a wiring member having conductivity;
   an electrical connection box including a mating connector electrically and mechanically connected to the connector;
   a first positioning portion including a protrusion provided on one of the connection unit and the electrical connection box, protruding in an axial direction of the wiring member, and having a first through hole fastened with a bolt in a fastening direction intersecting the axial direction, and a pocket portion provided in the other of the connection unit and the electrical connection box, having one end in the axial direction opened, and having an insertion space portion into which the protrusion is inserted and a pair of second through holes which are provided in an upper wall on one side in the fastening direction in the insertion space portion and a lower wall of the other side in the fastening direction and aligned with the first through hole in the fastening direction and into which the bolt is inserted; and
   a second positioning portion including an annular protruding portion provided at one of a peripheral edge portion of the second through hole in an inner surface of the upper wall or the lower wall of the pocket portion and a peripheral edge portion of the first through hole in an upper surface of the protrusion that faces the upper wall or a lower surface of the protrusion that faces the lower wall and protruding in the fastening direction, and an annular recessed portion which are provided at the other of the peripheral edge portion of the first through hole and the peripheral edge portion of the second through hole and recessed in the fastening direction and into which the protruding portion is fitted.

2. The electronic component unit according to claim 1, wherein
   the first positioning portion and the second positioning portion are provided as a pair on both sides in a width direction intersecting the axial direction when viewed from the fastening direction so as to sandwich the connector and the mating connector.

3. The electronic component unit according to claim 1, wherein
   first tapered surfaces inclined inward in a radial direction of the first through hole or the second through hole toward the other side in the fastening direction are provided at an outer peripheral surface of the protruding portion and an inner peripheral surface of the recessed portion, respectively.

4. The electronic component unit according to claim 2, wherein
   first tapered surfaces inclined inward in a radial direction of the first through hole or the second through hole toward the other side in the fastening direction are provided at an outer peripheral surface of the protruding portion and an inner peripheral surface of the recessed portion, respectively.

5. The electronic component unit according to claim 1, wherein the upper wall and the lower wall of the pocket portion are elastically deformable in the fastening direction, and the protrusion is attached to the insertion space portion of the pocket portion by press-fitting.

6. The electronic component unit according to claim 2, wherein the upper wall and the lower wall of the pocket portion are elastically deformable in the fastening direction, and the protrusion is attached to the insertion space portion of the pocket portion by press-fitting.

7. The electronic component unit according to claim 5, wherein a second tapered surface inclined so as to spread to at least both sides in the fastening direction toward one side in the axial direction is provided at an open end portion of the insertion space portion of the pocket portion.

8. A wire harness comprising:

a wiring member having conductivity;

a connection unit including a connector provided at a terminal of the wiring member;

an electrical connection box including a mating connector electrically and mechanically connected to the connector;

a first positioning portion including a protrusion provided on one of the connection unit and the electrical connection box, protruding in an axial direction of the wiring member, and having a first through hole fastened with a bolt in a fastening direction intersecting the axial direction, and a pocket portion provided in the other of the connection unit and the electrical connection box, having one end in the axial direction opened, and having an insertion space portion into which the protrusion is inserted and a pair of second through holes which are provided in an upper wall on one side in the fastening direction in the insertion space portion and a lower wall of the other side in the fastening direction and aligned with the first through hole in the fastening direction and into which the bolt is inserted; and a second positioning portion including an annular protruding portion provided at one of a peripheral edge portion of the second through hole in an inner surface of the upper wall or the lower wall of the pocket portion and a peripheral edge portion of the first through hole in an upper surface of the protrusion that faces the upper wall or a lower surface of the protrusion that faces the lower wall and protruding in the fastening direction, and an annular recessed portion which are provided at the other of the peripheral edge portion of the first through hole and the peripheral edge portion of the second through hole and recessed in the fastening direction and into which the protruding portion is fitted.

* * * * *